United States Patent [19]

Opheij

[11] Patent Number: 4,810,871
[45] Date of Patent: Mar. 7, 1989

[54] ELECTRONICALLY ADJUSTABLE POSITION-SENSITIVE RADIATION DETECTOR AND OPTICAL SYSTEMS USING SAME

[75] Inventor: Willem G. Opheij, Eindhoven, Netherlands

[73] Assignee: U.S. Philips Corporation, New York, N.Y.

[21] Appl. No.: 929,135

[22] Filed: Nov. 10, 1986

[30] Foreign Application Priority Data

Jul. 2, 1986 [NL] Netherlands ............... 8601719

[51] Int. Cl.$^4$ ............................................. G11B 5/09
[52] U.S. Cl. ................................. 250/201; 250/211 J; 369/45
[58] Field of Search ............... 250/211 J, 204, 203 R, 250/370, 371 H, 332, 211 R, 394, 578, 201 D; 357/30 R; 369/44–46

[56] References Cited

U.S. PATENT DOCUMENTS 3,704,376 11/1972 Lehovec et al. ............... 250/211 R
3,742,223 6/1973 Carr et al. ...................... 250/211 J
3,870,887 3/1975 Dueker et al. ................. 250/211 J
4,123,652 10/1978 Bouwhuis ....................... 250/204
4,273,998 6/1981 Kanamaru ....................... 250/204

Primary Examiner—Edward P. Westin
Assistant Examiner—Charles F. Wieland
Attorney, Agent, or Firm—Thomas Briody

[57] ABSTRACT

A position-sensitive radiation detector, which on a plane surface has at least two adjacent reverse-biassed radiation-sensitive diodes, includes a bias circuit for establishing differences in the reverse voltages across the diodes in order to adjust the boundary between the radiation-sensitive areas of the diodes. To adjust the position of the boundary relative to the locations where a radiation beam is incident on the detector use can be made of the photoelectric currents generated in the radiation-sensitive diodes by the radiation beams for comparing the actual position of the boundary with the desired position of the boundary. The position-sensitive radiation detector is particularly suitable for use in the focus-error detection system of an optical read and/or write apparatus.

7 Claims, 6 Drawing Sheets

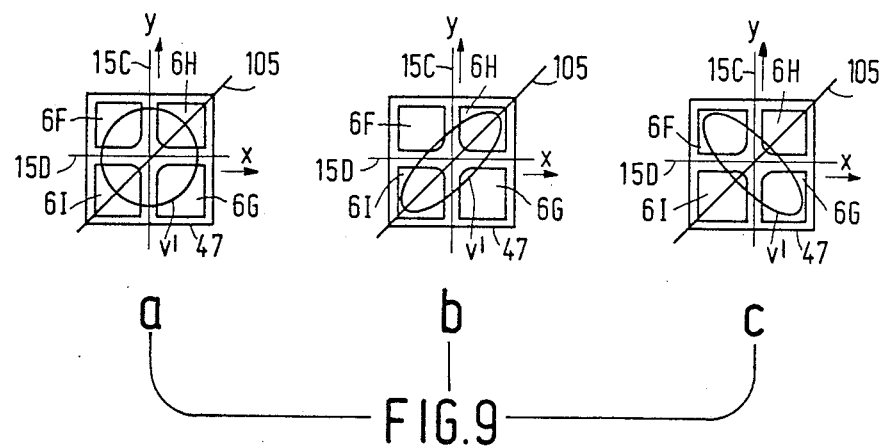
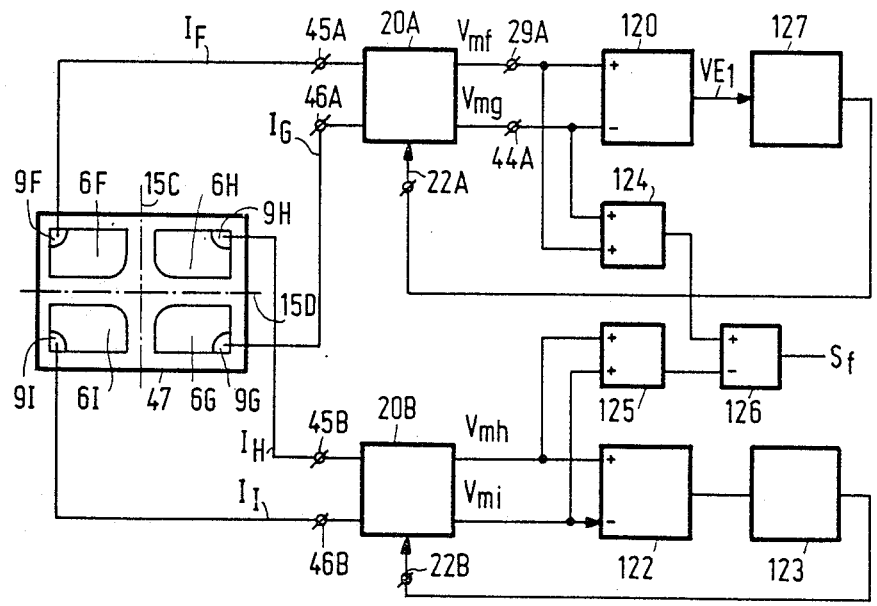
FIG.9
FIG.10

ELECTRONICALLY ADJUSTABLE POSITION-SENSITIVE RADIATION DETECTOR AND OPTICAL SYSTEMS USING SAME

BACKGROUND OF THE INVENTION

The invention relates to a radiation-sensitive semiconductor device comprising a semiconductor body which provided with at least two sub-elements on a substantially plane surface, which subelements constitute radiation-sensitive diodes with the adjoining parts of the semiconductor body, the distance between the subelements being small enough to enable the zone of the semiconductor body between the subelements to be depleted completely by the depletion regions associated with the subelements by applying a reverse voltage across the diodes, so as to inhibit charge transfer between the subelements and a circuit for applying reverse voltage across the radiation-sensitive diodes and for detecting the photoelectric currents generated by the radiation in & the radiation-sensitive areas of the diodes constituted by the depletion regions.

Radiation-sensitive semiconductor devices of the above type are employed, for example, in light-sensitive circuit arrangements for image reproduction and in apparatuses for tracking or positioning light beams (or beams of radiation of a different kind). Other uses of radiation detection lie in the field of spectroscopic analysis, in particular in the waverange from 200-1100 nanometers and, for example, soft X-rays. More& over, such devices are employed for the detection of corpuscular radiation (for example electrons, α-particles or high-energy particles). Further, such semiconductor devices (specifically in the waverange of visible light) are utilized in measuring equipment for positioning detection, for example for flexure measurement, or for example in automatic assembly lines.

The invention further relates to a focus-error detection system equipped with such a semiconductor device and to an apparatus for reading and/or recording information in a radiation-recording surface of a record carrier, which apparatus is equipped with such a focus-error detection system.

A semiconductor device of the type defined above the opening paragraph is known from Netherlands Patent Application no. 8003906 laid open to public inspection on the Feb. 1, 1982, corresponding to U.S. patent application Ser. No. 153,523. Said application describes a quadrant diode, comprising four radiation-sensitive diodes which are arranged symmetrically relative to a common center. When the quadrant diode is exposed to a beam of radiation, currents are generated in the four diodes, the magnitude of each diode current being dependent upon the amount of radiation incident on the radiation sensitive area of the relevant diode. The differences between the diode currents are representative of the position where the radiation beam is incident on the quadrant diode relative to the common center. The above Patent Application also describes a focus-error detection system which utilizes the quadrant diode for the purpose of detecting a deviation between a radiation-reflecting or first plane and a focussing or second plane of an objective system (for example for use in a Compact-Disc or video-disc apparatus). The known quadrant diode is very fast and has a high resolution and a high radiation sensitivity, but during assembly the diode has to be mounted in such a way that in the case of a correct focussing the radiation beam is incident on the semiconductor surface exactly centered relative to the four quadrants of the diode. In view of the required tolerances (the quadrants are spaced approximately 5 micrometers from one another) such an assembly procedure with the corresponding alignment is difficult and time-consuming.

Similar assembly problems occur in a focus-error detection system in which in the path of the beam reflected from the radiation-reflecting surface a beam-splitting element is arranged, followed by a radiation-sensitive detection system comprising a plurality of detectors which are spaced from each other by narrow strips, the subbeams formed by the beam-splitting element being incident on the separating strips. In the last-mentioned case it is possible to ensure that the centers of the radiation spots formed in the detector plane by the subbeams are situated on the separating strips in the case of a correct focussing by arranging these strips at an acute angle to one another. By mechanically shifting the detector plane a correct preliminary adjustment can be obtained, as is described in more detail in Netherlands Patent Application no. 8202058, corresponding to U.S. Pat. No. 4,533,826. However, this mechanical adjustment may vary with time and/or temperature, necessitating an often tedious readjustment of the detector plane.

SUMMARY OF THE INVENTION

It is an object of the invention to provide a semiconductor device of the type defined above, which is suitable for use inter alia in such a focus-error detection system, enabling the zero adjustment to be simplified substantially. Moreover, such a semiconductor device is suitable for uses other than those mentioned above. In the radiation-sensitive semiconductor device of the type defined in the opening paragraph this object is achieved in that the circuit comprises means for applying different reverse voltages across the diodes depending on a control signal, in order to adjust the boundaries between the radiation-sensitive areas of the diodes.

The invention is based on the recognition of the fact that by applying different reverse voltages across the diodes, the boundary between radiation-sensitive areas of adjacent diodes is shifted, so that a simple electronic zero adjustment is possible which, when the radiation-sensitive device is employed in ah opto-electronic focus-error detection system, can replace the intricate mechanical adjustment.

The radiation-sensitive semiconductor device may be characterized in that the circuit comprises at least one differential amplifier which is fed back and which is intended for converting one of the photo-electric currents generated by the radiation into a measurement signal, for which purpose one of the subelements is coupled to the inverting input of the differential amplifier for applying the current to be converted to said input, the circuit further comprising means for applying a voltage whose amplitude depends on the control signal to the non-inverting input of the differential amplifier. This embodiment utilizes the property of a feedback differential amplifier that as a result of the feedback the voltage on the inverting input depends on the voltage on the non-inverting input. This enables the difference in the reverse voltages across the diodes to be adjusted to a desired value dictated by the control signal by varying the voltage on the non-inverting input.

A further embodiment is characterized by a second differential amplifier for generating a measurement signal which is a measure of the difference between the output voltage of the first differential amplifier and the control voltage on the non-inverting input of the first differential amplifier, for which purpose an input of the second differential amplifier is coupled to the output of the first differential amplifier and for which purpose the circuit comprises means for applying a voltage proportional to the control voltage to the other input of the second differential amplifier. In this embodiment a measurement signal which is independent of the control signal is derived from the output signal of the first differential amplifier in a simple way.

An opto-electronic focus-error detection system provided with the radiation-sensitive semiconductor device, for detecting in an optical system a deviation between an element and a plane of focussing of an objective system, for use in an apparatus for reading a record carrier having an optically readable information structure or an apparatus for optically recording information in a record carrier is characterized in that the radiation-sensitive semiconductor device comprises a first pair and a second pair of adjacent subelements, a beam-splitting element being arranged in the optical path between the element and the semiconductor device to form a first subbeam and a second subbeam, which are incident on the semiconductor device in the zone between the first pair of subelements and the zone between the second pair of subelements respectively, the focus-error detection system comprising a circuit for deriving a focus-error signal from the photoelectric currents generated in the depletion regions associated with the subelements by the subbeams and a control device for deriving the control signals for the boundary-adjusting means from the photo electric currents thus generated, in such a way that a first sum of the photoelectric current corresponding to that subelement of the first pair which is situated farther from the center between the locations where the subbeams are incident on the semiconductor device and the photoelectric current corresponding to that subelement of the second pair which is situated nearer said center is substantially equal to a second sum of the electric currents associated with the other subelements of said pairs. In such an opto-electronic focus-error detection system the positions of the boundaries between the radiation-sensitive areas associated with the subelements during operation automatically become such that the first sum of photoelectric currents is equal to the second sum, which means that the boundaries are automatically situated symmetrically relative to the center between the locations of incidence of the subbeams on the semiconductor device. This considerably simplifies adjustment of the system after assembly.

Another embodiment of the opto-electronic focus-error detection system comprising the radiation-sensitive semiconductor device for detecting in an optical system a deviation between an element and a plane of focussing of an objective system, in particular for use in an apparatus for reading a record carrier with an optically readable information structure or an apparatus for optically recording information in the record carrier, is characterized in that the radiation-sensitive semiconductor device comprises four subelements which are situated symmetrically relative to a common center, an astigmatic element being arranged between the reflecting element and the semiconductor device in the optical path of a light beam, and the focus-error detection system comprising a circuit for deriving the focus-error signal from the photoelectric currents generated by the beam in the depletion regions associated with the subelements and a control device for deriving the control signals for the bounary-adjusting means, in such a way that the photoelectric currents corresponding to two diagonally opposed subelements are substantially equal to each other. In such a focus-error detection system the boundaries between the radiation-sensitive areas of the semiconductor device are automatically adjusted in such a way that at the location of the incidence on the semiconductor device the center of gravity of the beam coincides with the point of intersection of the boundaries between the radiation sensitive areas. When such a focus-error detection circuit is utilized the semiconductor device can be mounted very simply and it is only necessary to ensure that the beam is incident on the semiconductor device in such a way that its center is situated within the electronic adjustment range of the boundaries.

BRIEF DESCRIPTION OF THE DRAWING

Embodiments of the invention and further advantages thereof will now be described in more detail, by way of example, with reference to FIGS. 1 to 10, in which

FIGS. 8 and 10 show another focus-error detection system in accordance with the invention;

FIGS. 9 (a, b and c) serves to clarify operation of the embodiments shown in FIGS. 8 and 10.

Figure 1:
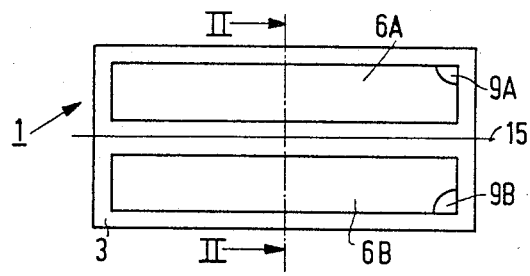
FIGS. 1 and 2 show a radiation-sensitive element for use in the semiconductor device in accordance with the invention.

The Figures are shown schematically and not to scale and, for the sake of clarity, in particular the dimensions in the thickness direction are shown exaggerated in the cross-sectional views. In general, semiconductor zones of the same conductivity type are hatched in the direction. As a rule, similar elements of the embodiments bear the same reference numerals, while in some cases letters are suffixed to the reference numerals for the sake of clarity.

DESCRIPTION OF THE PREFERRED EMBODIMENTS

Figure 2:
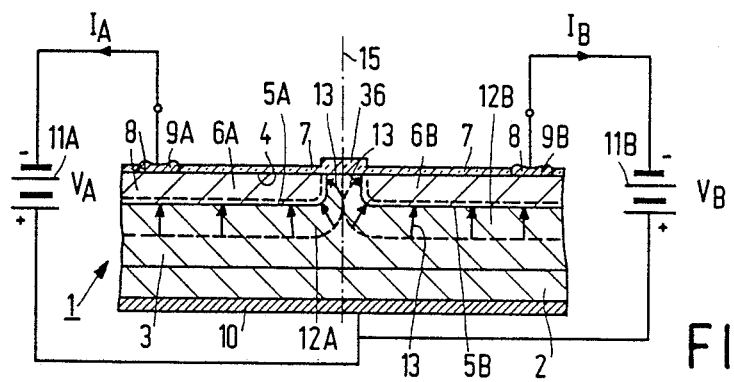

FIGS. 1 and 2 show a radiation-sensitive element 1 for use in the semiconductor device in accordance with the invention, FIG. 1 being a plan view and FIG. 2 a sectional view taken on the line II—II. The radiation sensitive element 1 comprises a low-impedance substrate 2 on which an epitaxial layer 3 is provided. Further, the radiation-sensitive element is provided with mutually isolated rectifier functions 5 (5A, 5B) on a substantially plane surface 4. For this purpose the surface 4 of the element 1 is provided with p-type surface regions 6 (6A, 6B) which constitute rectifier junctions 5 (pn-junctions) with the epitaxial layer 3. The surface 4 of the element 1 is further covered with a passivating anti-reflection layer 7 of silicon oxide. In the layer 7 contact apertures 8 are formed for the contacts 9 (9A, 9B). Contact with the substrate 2 is provided by means of a contact metallization 10 on the underside of the element.

By means of voltage sources 11A and 11B a voltage BVA and BVB respectively is applied between the contact metallization 10 and the contacts 9A and 9B respectively, so that the rectifier junctions 5A and 5B are reverse-biassed. As a result of this, a depletion area is created near each rectifier junction 5 in the epitaxial layer 3 and he associated surface region 6, indicated by means of broken lines in FIG. 2. When the depletion regions extend into the epitaxial layer 3, these regions are indicated by the reference numeral 12 (12A, 12B). The electric field lines 13 represent the electric fields prevailing in the depletion regions 12.

When light or radiation of sufficiently high energy (at least equal to the width of the band gap of the semiconductor material) is incident on the surface 4 of the element 1, additional charge carriers (holes and electrons) are generated in the semiconductor body. In the depletion regions these additional charge carriers are drained as a result of the prevailing field and thus contribute to a photoelectric current through the associated pn-junction.

The distances between the subelements are so small that by applying a reverse voltage across the radiation-sensitive diode regions situated between adjacent subelements can be depleted by the depletion regions associated with the subelements.

At the location of the interface between the depletion regions 12A and 12B the electric field lines are deflected in such a way that as the electric field causes the charge carriers generated in the depletion region to migrate practically always to the corresponding pn-junction (the boundary between the depletion zones 12A and 12B bears the reference numeral 15). In this way they contribute to the photoelectric current generated in this pn-junction. The photoelectric currents generated in the pn-junctions 5A and 5B are indicated by $I_A$ and $I_B$ respectively. When the center of a beam which is perpendicularly incident on the surface 4 coincides with the boundary 15 the photoelectric currents $I_A$ and $I_B$ thus generated will be substantially equal to each other. If the position of the incident beam is slightly offset relative to the boundary 15, differences will occur between $I_A$ and $I_B$.

Figure 3A:
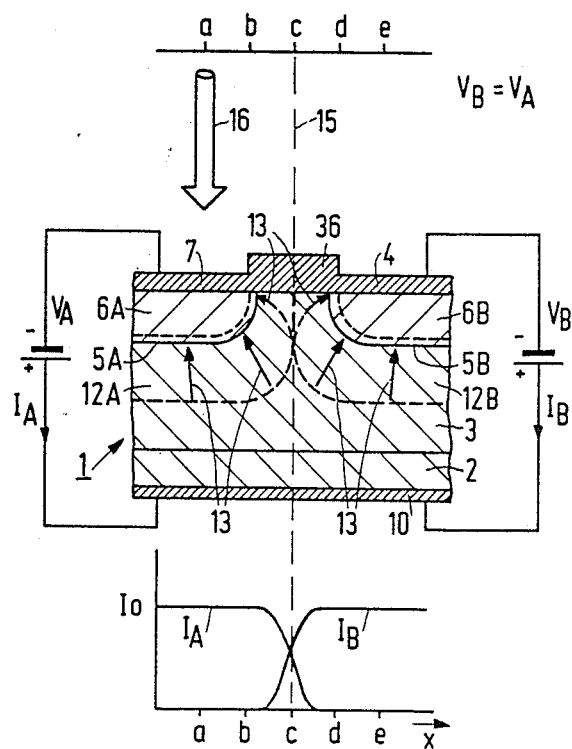
FIGS. 3a, 3b and 3c illustrate the influence of a difference in the reverse voltage of the radiation-sensitive diodes of the radiation-sensitive elements on the position of the boundary between the radiation-sensitive areas of the diodes.

FIG. 3a shows the variation of the currents $I_A$ and $I_B$ as a function of the location of incidence x of the beam relative to the boundary 15 in the case that the reverse voltages VA and VB are equal to each other. The reference numeral 16 in this Figure represents a beam, for example a laser beam, which moves over the surface 4 of the semiconductor body. When the beam 16 is situated at the location of point a the photoelectric current produced in the underlying pn-junction 5A is generated almost exclusively in a flat part of this junction parallel to the surface 4. This gives rise to a current $I_A$ of the value $I_o$ through this junction. The current $I_B$ through the adjacent pn-junction 5B is negligibly small. Not all the charge carriers generated by the beam 16 contribute to the photoelectric current in point a because a part is lost as a result of recombination in the surface region 6A (and, if applicable, also to a small extent in the non-depleted part of the epitaxial layer 3). Moreover, the incident radiation is reflected to a small extent by a passivating layer 7 and is slightly absorbed in the surface region 6A before this radiation reached the depletion region of the pn-junction 5A. If the beam is situated at the location of point b, the influence of the curvature of the pn-junction 5A becomes perceptible. The distance between the surface 4 and the depletion region is shorter, so that less charge carriers are lost as a result of recombination and, moreover, less radiation is absorbed in the surface region 6A. In the case of a constant thickness of the layer 7 this would result in an additional contribution to the photoelectric current. However, between the surface regions 6A and 6B the layer 7 exhibits a thickened portion 36 which is selected in such a way that a larger amount of light is reflected at the location of this thickened portion to ensure that the current $I_A$ remains substantially the same.

As soon as the beam 16 reaches point c, which is situated practically midway between the two surface regions, a part of the radiation of the beam 16 will penetrate the depletion region 12B. As a result of the prevailing electric field the charge carriers generated by this part of the radiation are transferred mainly to the pn-junction 5B, so that the current $I_A$ decreases, while the current $I_B$ increases. As the beam 16 moves further, the current $I_B$ increases rapidly to the value $I_o$, while the current $I_A$ then decreases to substantially zero.

In the case illustrated in FIG. 3A the voltages $V_A$ and $V_B$ are equal to each other. In that case the boundary 15 between the radiation-sensitive areas is situated midway between the surface regions 6A and 6B.

The current $I_A$ is produced mainly by charge carriers generated in the depletion region 12A to the left of the boundary 15, while the current $I_B$ is generated mainly by the charge carriers generated in the depletion region 12B. If $V_A$ and $V_B$ are not equal to each other, the depletion regions 12A and 12B are no longer symmetrical relative to the center between the surface regions 6A and 6B, which means that the boundary 15 between the radiation-sensitive areas of the diodes is offset from the center between the surface region 6A and 6B. For the situation in which $V_A$ is larger than $V_B$ and $V_A$ is smaller than $V_B$, FIGS. 3b and 3c respectively represent schematically the locations of the depletion regions 12A and 12B relative to the center between the subelements 6A and 6B and the corresponding variations of the currents $I_A$ and $I_B$.

Figure 3B:
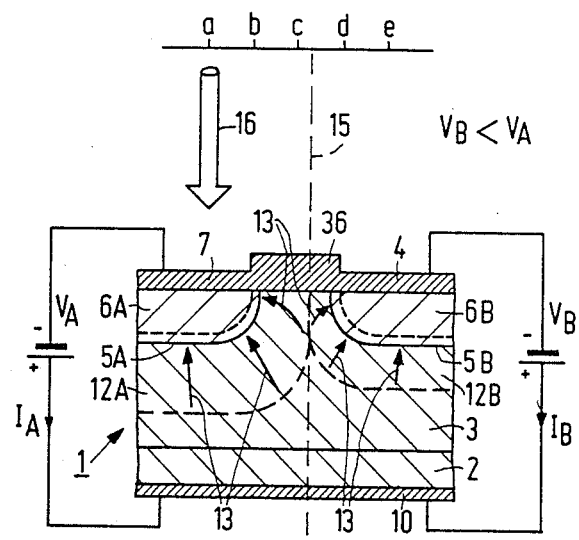
Figure 3C:
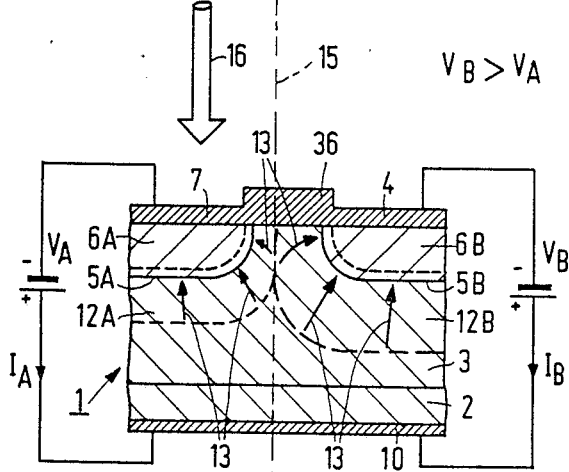

As is evident from FIGS. 3a, 3b and 3c, the position of the boundary 15 between the radiation-sensitive areas of the diodes constituted by the subelements 6 and the epitaxial layer 3 depends on the magnitude of the difference between the reverse voltage $V_A$ and $V_B$.

Figure 4:
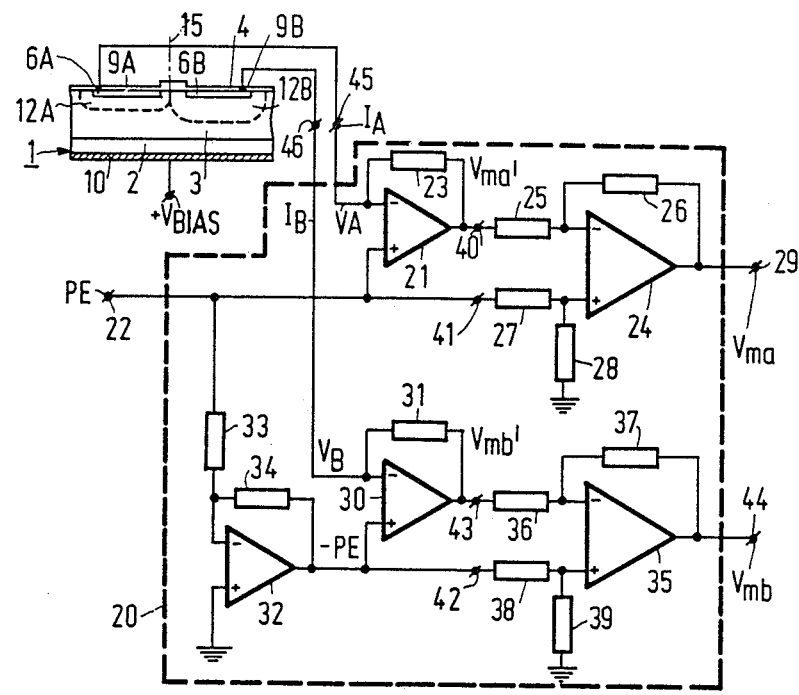
FIGS. 4 and 5 show semiconductor devices in accordance with the invention.

FIG. 4 shows an embodiment of the device in accordance with the invention. In this Figure the reference numeral 20 identifies a bias circuit for applying different reverse voltages $V_A$ and $V_B$ across the radiation-sensitive diodes of the radiation-sensitive element 1, which diodes are formed by the surface regions 6A and 6B and the epitaxial layer 3. The circuit 20 comprises an operational amplifier 21, whose inverting input is connected to the contact 9A of the surface region 6A. The non-inverting input of the operational amplifier 21 is connected to an input terminal 22. The output of the operational amplifier 21 is coupled to its inverting input via a resistor 23. The output of the amplifier 21 is connected to the inverting input 40 of a differential amplifier comprising an operational amplifier 24 and the resistors 25, 26, 27 and 28. The non-inverting input 41 of the differential amplifier is connected to the input terminal 22.

The output of the operational amplifier 24 is connected to an output terminal 29.

The contact 9B of the surface region 9B is connected to the inverting input of an operational amplifier 30, whose output is also connected to the inverting input via a resistor 31. The control signal PE on the input terminal 22 is inverted by means of an inverting amplifier comprising an operational amplifier 32 and resistors 33 and 34 and is subsequently applied to the non-inverting input of the operational amplifier 30 and to the non-inverting input 42 of a differential amplifier comprising an operational amplifier 35 and resistors 36, 37, 38 and 39. The output of the operational amplifier 30 is connected to the inverting input 43 of the differential amplifier comprising the operational amplifier 35. The output of the operational amplifier 35 is connected to the input terminal 44.

Further, the metallization layer 10 is maintained at a constant voltage $V_{BIAS}$ by means of a voltage (not shown). As a result of the feedback resistor 32 arranged across the operational amplifier 21 the voltages on the inverting input and the non-inverting input of the operational amplifier 21 are substantially equal to each other, so that the voltage difference between the contact 9A and the metallization layer 10 is equal to $V_{BIAS}-V_{pe}$, where $V_{pe}$ is the amplitude of the voltage of the control signal PE. The voltage on the non-inverting input of the operational amplifier 30 is $-V_{pe}$, so that the voltage difference between the contact 9B and the metallization layer 10 is equal to $V_{BIAS}+V_{pe}$. As a result of the voltage difference of 2 $V_{pe}$ between contacts 9A and 9B the boundary 15 between the radiation-sensitive areas of the diodes of the element is shifted relative to the center between the surface regions 6A and 6B by a distance determined by the control signal PE. If a radiation beam is incident on the surface 4, photoelectric currents $I_A$ and $I_B$ are generated in the depletion regions 12A and 12B, the ratio between the currents $I_A$ and $I_B$ being determined by the location of incidence of the beam relative to the boundary 15. The currents $I_A$ and $I_B$ are converted into a voltage $V_{ma}$, and a voltage $V_{mb}$, respectively by means of operational amplifiers 21 and 30.

The voltage $V_{ma}{'}$ comprises a component determined by the control signal PE and a component determined by the current $I_A$. By means of the operational amplifier 24, which is arranged as a differential amplifier, a voltage $V_{ma}$ is produced on the output terminal 9, in which voltage the component determined by PE is eliminated, so that the voltage $V_{ma}$ is proportional to the current $I_A$. Similarly, a voltage $V_{MB}$ proportional to the current $I_B$ is generated on an output terminal 44.

When the radiation-sensitive element 1 described above together with the associated adjusting circuit 20 is mounted in an optical system it is possible after assembly to apply such a difference voltage between the contacts 9A and 9B by means of a control signal PE that the boundary 15 coincides with the center of the location where the radiation beam is incident on the radiation-sensitive element. Such a radiation-sensitive element in an opto-electronic apparatus is aligned in that after assembly of this apparatus and correct adjustment of, for example, he focus of an objective system the position of an incident beam is measured by measuring the voltage difference between $V_{ma}$ and $V_{mb}$. Depending on the result of this measurement the voltage difference between the contacts 9A and 9B can be adjusted by varying the amplitude $V_{pe}$ of the control signal PE in such a way that the difference $V_{ma}-V_{mb}$ indicates that $I_A$ is equal to $I_B$ (calibration point).

When the voltage difference between the contacts 9A and 9B is maintained, a difference between $V_{ma}$ and $V_{mb}$ is now a measure of a deviation from the position of the location of incidence of the radiation beam relative to the said calibration point corresponding to the position of the boundary 15. The voltage difference $\Delta V_m=(V_{ma}-V_{mb})$ may subsequently be used as the control signal; a deviation $\Delta V_m$ corresponds to a specific deviation of the location of incidence of the beam relative to the adjusted position of the boundary 15. This yields a control system which can be mounted with ample tolerances and which is calibrated almost entirely by electrical or electronic means.

Figure 5:
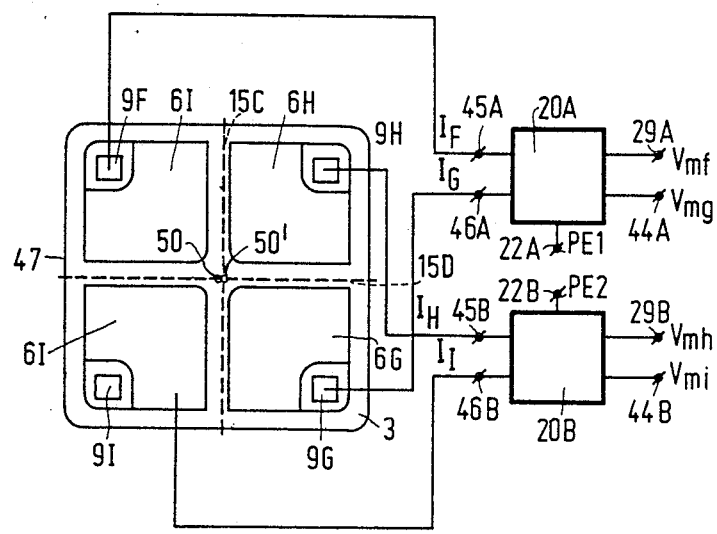

FIG. 5 shows a semiconductor device in accordance with the invention, employing a quadrant diode 47. Such a diode comprises four surface regions 6F, 6G, 6H and 6I which are situated symmetrically about a common center 50.

The contacts 9F and 9G and the contacts 9H and 9I of the surface regions 6F and 6G and the surface regions 6H and 6I are connected to the input terminals of an adjusting circuit 20A and an adjusting circuit 20B of the type described in the foregoing. If the voltages across the radiation-sensitive diodes formed by the surface regions 6F, 6G, 6H and 6I together with the epitaxial layer 3 are equal to each other the photoelectric currents $I_F$, $I_G$, $I_H$ and $I_I$ are substantially identical if the radiation beam is centered relative to the surface regions. A mismatch during assembly as a result of which the center of the beam is incident at a location 50' after adjustment of the optical system can be corrected as described hereinbefore by means of control signals $PE_1$ and $PE_2$ on the inputs 22A and 22B of the adjusting circuits 20A and 20B. By a correct adjustment of the control signals $PE_1$ and $PE_2$ the boundaries 15C and 15D between the radiation-sensitve areas are shifted in such a way that the point of intersection of the boundaries 15C and 15D coincides with the center of the incident beam.

Figure 6:
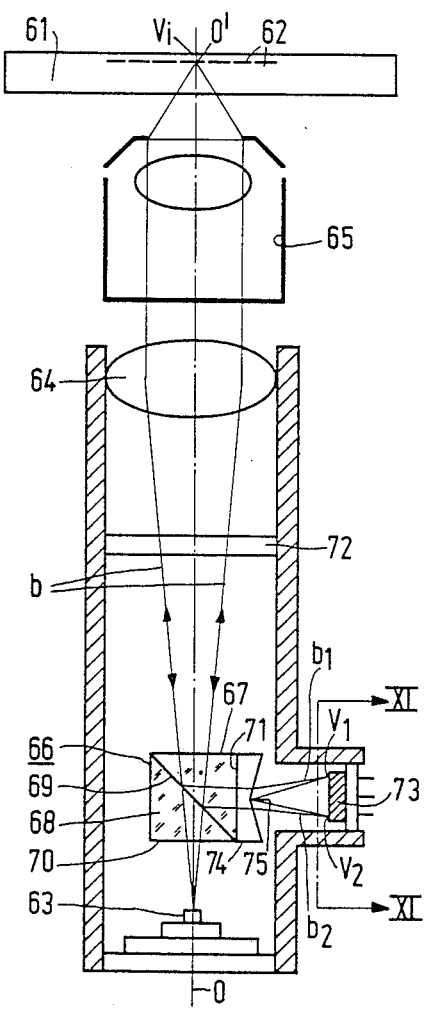
FIGS. 6 and 7 show a focus-error detection system in accordance with the invention.

A semiconductor device in accordance with the invention may be employed in, for example, a focus-error detection system as shown in FIG. 6. FIG. 6 shows a small part of a round disc-shaped record carrier 61 in radial cross-section. The radiation-reflecting information structure is situated on the upper side of the record carrier and comprises a multitude of information areas, not shown, which are arranged in information tracks 62. The information structure is scanned by a read beam b produced by a radiation source 63, for example a semiconductor diode laser. A lens 64 forms the diverging beam into a parallel beam of such a cross-section that the pupil of an objective system 65 is filled in an adequate manner. This objective system then forms a radiation spot $V_i$ of minimal dimensions on the information structure.

The read beam is reflected from the information structure and, as the record carrier moves relative to the read beam, the reflected beam is time-modulated in conformity with the information recorded in the record carrier. In order to separate the modulated beam from the beam emitted by the radiation source a beam-separating prism 66 is arranged between the radiation source and the objective system. This prism may comprise two prismatic sections 67 and 68 between which a beam-separating layer 29 is interposed. The reference numerals 70 and 71 respectively denote the entrance face and the exit face of the prism 66. The layer 69 may be a semitransparent mirror. In order to minimize the radiation loss in the read unit a polarization-sensitive separating layer may be employed. A λ/4 plate 72 should then be arranged between the objective system and the prism 66, λ being the wavelength of the read beam b. This prism is traversed twice by the read beam and rotates the plane of polarization of the beam through 90° in total. The beam emitted by the radiation source is then almost wholly transmitted by the prism, while the modulated beam is almost wholly reflected towards a radiation-sensitive detection system 33 which supplies a signal which is modulated in conformity with the information stored in the record carrier.

Figure 7:
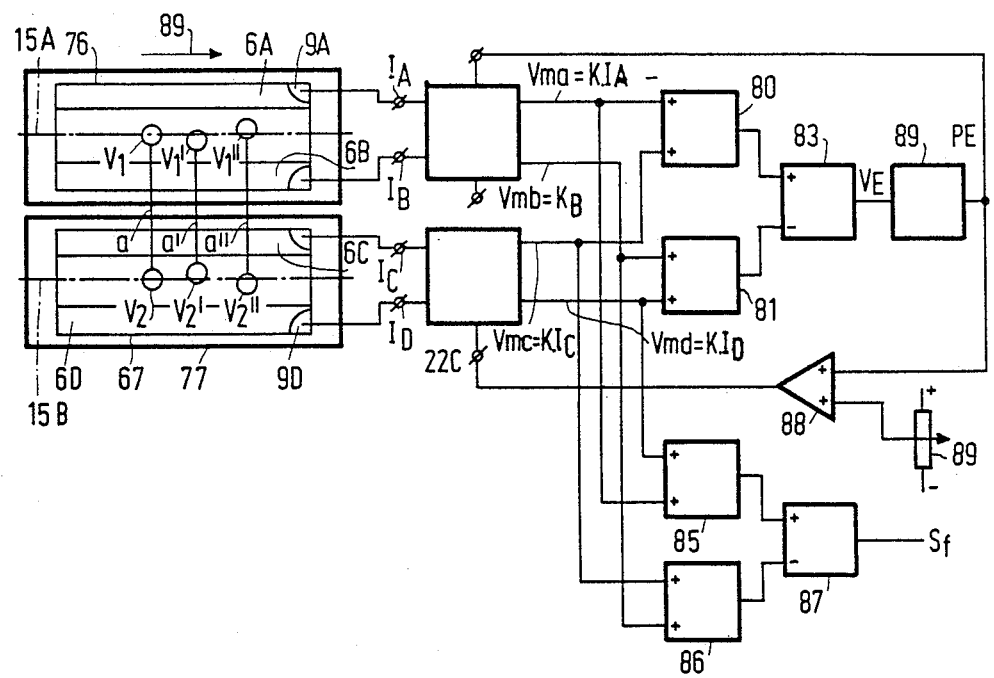

In order to generate the focus-error signal which provides an indication of the magnitude and direction of a deviation between the plane of focussing of the objective system and the plane of the information structure a roof prism 74 is arranged on the exit face 71 of the beam-separating prism 66 and the radiation-sensitive detection system 73 comprises, for example, two radiation-sensitive devices as described with reference to FIGS. 1 and 2. In FIG. 7, which illustrates the principle of focus-error detection, these two devices bear the reference numerals 76 and 77. This Figure shows inter alia a sectional view of the semiconductor devices, taken on the line XI—XI in FIG. 6 and shows schematically the auxiliary electronic circuit for adjusting the difference voltages for the purpose of zero setting.

The refractive edge 75 of the prism 74 extends parallel to the optical axis 00' in FIG. 6 of the read unit.

The roof prism splits the beam b into two sub-beams $b_1$ and $b_2$ which are incident on the devices 76 and 77 respectively.

FIG. 6 illustrates the situation in which the read beam is focused exactly in the plane of the information structure. The read unit may be constructed in such a way that the focus of the reflected beam is situated exactly on the surface of the radiation-sensitive element 1 of the detector 76, 77. In the case of a correct focussing the distance between the centers of the radiation spots $V_1$ and $V_2$ formed on the detectors 76 and 77 by the beams $b_1$ and $b_2$ is a.

In the case of a focus error the energy distribution within the sub-beams $b_1$ and $b_2$ relative to the associated detectors changes, which may also be regarded as a displacement of the radiation spots $V_1$ and $V_2$ formed by the sub-beams relative to the detectors. If the focus of the beam originating from the radiation source is situated above the plane of information structure, the beams $b_1$ and $b_2$ are moved inwards and the semiconductor zones 6A and 6D receive less radiation energy than the semiconductor zones 6B and 6C (the distance between the radiation spots $V_1'$ and $V_2'$ is then a'). If the focus of the beam emitted by the radiation source is situated below the plane of the information structure, the situation is reversed and the semiconductor zones 6B and 6C receive less radiation energy than the semiconductor zones 6A, 6D and 19 (the distance between the radiation spots $V_1''$ and $V_2''$ is then a'').

For the sake of clarity FIG. 7 shows the positions of the radiation spots $V_1$, $V_1'$ and $V_1''$ and $V_2$, $V_2'$ and $V_2''$ shifted in a direction parallel to the boundary 15. It is to be noted that in reality the positions of the radiation spots in this direction do not change when the focussing changes. If the boundaries 15A and 15B between the radiation-sensitive areas are adjusted in such a way that in the case of a correct focussing the centers of the radiation spots $V_1$ and $V_2$ coincide with the boundaries 15A and 15B respectively it is simply possible to derive a measure of the focussing error $S_2$ from the photoelectric currents $I_A$, $I_B$, $I_C$ and $I_D$ associated with the surface regions 6A, 6B, 6C and 6D in conformity with the relationship:

$$S_r = K\{(I_A + I_D) - (I_B + I_C)\},$$

where K is a constant.

A correct adjustment of the boundaries 15C and 15D can be obtained by adjusting the distance between the boundaries and an adjustment which ensures that when the distance between the boundaries 15 remains the same these boundaries 15 are adjusted in such a way that they are situated symmetrically relative to the center between the radiation spots formed on the detectors 76 and 77 by the beams $b_1$ and $b_2$.

A symmetrical position of the boundaries relative to said center between the radiation spots can be determined simply by means of the currents $I_A$, $I_B$, $I_C$ and $I_D$. This is because the difference $(I_A + I_C) - (I_B + I_D)$ is representative of the difference in distance between the center between the boundaries 15A and 15B and the center between the radiation spots.

FIG. 7 also shows a control system for automatically symmetrizing the boundaries 15A and 15B relative to the center between the radiation spots on the basis of the difference $(I_A + I_C) - (I_B + I_D)$. This control system comprises a section for determining a measure VE of the difference $(I_A + I_C) - (I_B + I_D)$ formed by the bias circuits 20 and 20C; adder circuits 80 and 81 and a differential amplifier 83, and a section comprising the control circuit 80 for deriving from the signal VE the control signal PE for the adjusting circuits 20 and 20C, in such a way that the difference $(I_A + I_C) - (I_B + I_D)$ is maintained equal to zero. Since in this control system a variation of the amplitude of the signal PE on the two control inputs 22 and 22C results in a similar voltage variation, the boundaries 15A and 15B are both shifted in a same direction and over substantially the same distance upon a change in amplitude of the control signal PE, so that the distance between the boundaries 15A and 15B is substantially independent of the control signal PE.

The distance between the boundaries 15A and 15B can be adjusted by providing a voltage difference between the inputs 22 and 22C. This can be achieved, for example, by arranging in the connection between the output of the control circuit 84 and the control input 22C an adder circuit 88 which has one input connected to the output of the control circuit 84 and which has another input connected to a potentiometer 89 for adjusting the voltage difference between the control input 22 and 22C. Further, the arrangement shown in FIG. 7 comprises adder circuits 85 and 86 and a difference circuit 87 for generating a focus-error signal $S_f$ in the customary manner in conformity with the following relationship:

$$S_f = (V_{ma} + V_{md}) - (V_{mb} + V_{mc}) = K\{(I_A + I_D) - (I_B + I_C)\},$$

where K is a constant.

The focus-error signal $S_f$ represents the distance between the boundaries 15A and 15B and the distance between the centers of the radiation spots $V_1$ and $V_2$, which difference is proportional to the focus error in the case of a correct adjustment of the distance between the boundaries 15A and 15B.

If the focus-error detection device shown in FIGS. 6 and 7, which comprises detectors with electrically adjustable boundaries, has been assembled, the system can be adjusted by a correct adjustment of the distance between the boundaries 15A and 15B, for example by means of the potentiometer 89. The desired symmetry of the boundaries relative to the center between the radiation spots is then obtained automatically. It is apparent that the correct distance between the boundaries can also be obtained in another manner, for example by means of the mechanical adjustment device described in the aforementioned Netherlands Patent Application No. 8202058.

Figure 8:
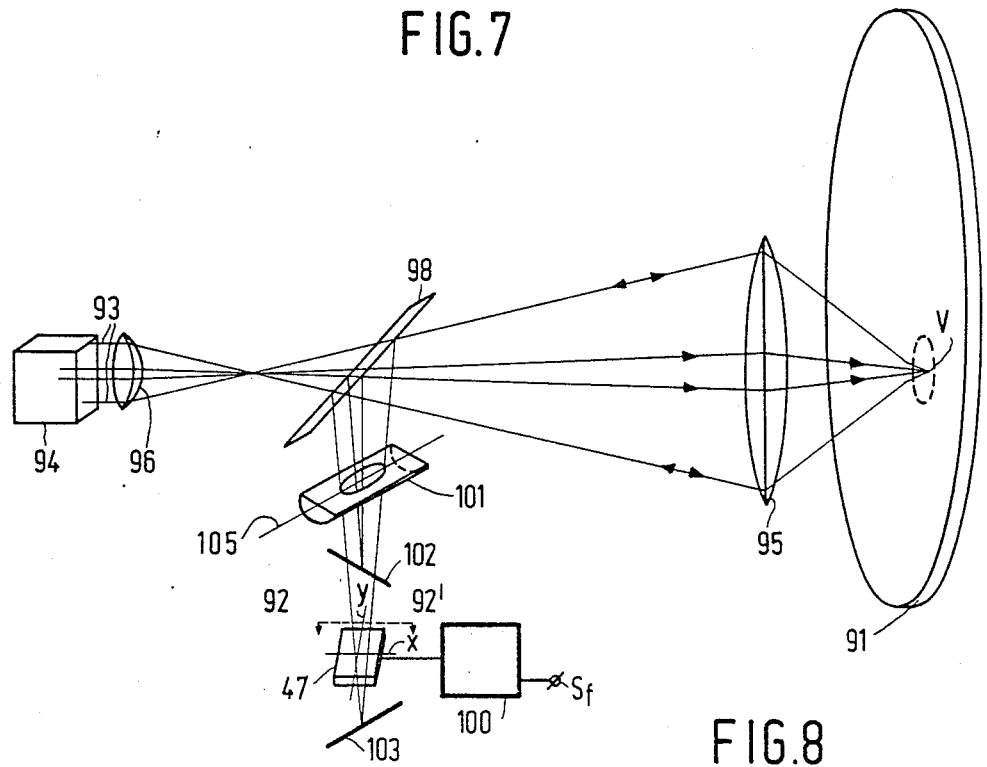

A semiconductor device in accordance with the invention may also be utilized in a focus-error detection system of the astigmatic type, for example as shown in FIG. 8. In this Figure the reference numeral 1 denotes a record carrier which is illuminated with a read beam 93 originating from a radiation source 94. An objective system 95 focusses the read beam to form a read spot V on the surface of the record carrier 1 on which the information structure is formed. The focal length of the auxiliary lens 96 is selected in such a way that the pupil of the objective system is filled adequately. The read beam is reflected from the record carrier and is then modulated in conformity with the information stored in a track portion to be read. For separating the emitted (non-modulated) and the reflected (modulated) read beam a beam splitter 98 is arranged in the radiation path. The beam splitter directs the modulated read beam to the detector 47 described in the foregoing, which detector is connected to a detection circuit 100 for deriving a focus-error signal $S_f$.

In order to enable focus errors to be detected, an astigmatic element 101 in the form of a cylindrical lens is arranged in the radiation path behind the beam splitter 98. Instead of one focus an astigmatic system has two astigmatic focal lines which, viewed in an axial direction, occupy different positions and which extend perpendicularly to one another. Thus, by means of the objective system 95 and the cylindrical lens 101 two focal lines 102 and 103 are assigned to the read spot V. The radiation-sensitive detector 47 is now arranged in a plane which, viewed along the optical axis, is situated between the lines 102 and 103, suitably at a location where the dimensions in two mutually-perpendicular directions of the image spot associated with the read spot V are equal to an optimum extent in the case of a correct focussing.

In order to enable the shape of the image spot V' and hence the degree of focussing to be determined, use is made of the detector 47 described with reference to FIG. 5, which detector comprises four subdetectors arranged in the four quadrants of an X-Y coordinate system. FIGS. 9a, 9b and 9c show the detector 47 in views taken on the line 92, 92' in FIG. 8, the various shapes of the image spot V' being projected thereon for different values of the distance between the objective system and the plane of the tracks. The X-axis and Y-axis extend at an angle of 45° to the axis 105 of the cylindrical lens, i.e. to the astigmatic focal lines 102 and 103, while the X-axis extends parallel to the effective track direction.

FIG. 9a illustrates the situation in which the distance between the objective system and the plane of the tracks is correct. If this distance is too large, the focal lines 102 and 103 are situated closer to the cylindrical lens 101. The detector 47 is then situated closer to the focal line 103 than to the focal line 102. The image spot V' then has a shape as shown in FIG. 9b. If the distance between the objective system and the plane of the tracks is too small, the focal lines 102 and 103 are situated farther from the cylindrical lens and the focal line 102 is situated closer to the detector 47 than the focal line 103. The image spot V' then has a shape as shown in FIG. 9c.

The detection circuit comprises an automatic bias circuit (see FIG. 10) which shifts the boundaries 15C and 15D in such a way that the center of the radiation spot $V_u'$ coincides with the intersection of the boundaries 15C and 15D. This circuit comprises a first section for establishing the voltage difference between the contacts 9F and 9G and a second section for establishing the voltage difference between the contacts 9H and 9I. The first section comprises the adjusting circuit 20A, a differential amplifier 120 for deriving a measure $VE_1$ of the difference between the currents $I_F$ and $I_G$ from the output signals $V_{mf}$ and $V_{mg}$, and a control circuit 121 for deriving from the measure $VE_1$ a signal $PE_1$ applied to the input 22A of the adjusting circuit 20A, so as to minimize the difference between $I_F$ and $I_G$. The second section comprises the adjusting circuit 20B, a differential amplifier 122 for deriving a measure $VE_2$ of the difference between the currents $I_H$ and $I_I$ from the output signals $V_{mh}$ and $V_{mi}$, and a control circuit 123 for deriving a signal $PE_2$ applied to the input 22B of the circuit 20B so as to minimize the difference between the currents $I_H$ and $I_I$.

By means of the circuit shown in FIG. 10 the detector 47 is adjusted fully automatically in such a way that the difference between $I_F$ and $I_G$ and the difference between $I_H$ and $I_I$ is minimized, which means that the intersection between the boundaries 15C and 15D coincides with the center of the incident beam. Further, the detection circuit 100 comprises a first adder circuit 124, a second adder circuit 125 and a difference circuit 126, for deriving a focus error-signal $S_f$ in conformity with the relationship $$S_f = V_{mf} + V_{mg} - V_{mh} - V_{mi}.$$

When use is made of a detection circuit with an electrically adjustable boundary between the radiation-sensitive areas of the detector and an automatic alignment circuit, mounting of the detector can proceed very simply, the only requirement being that the location where the center of the beam is incident on the detector is situated within the electronic adjustment range of the detector. Moreover, such an automatic adjustment has the advantage that slow variations in the parameters of the focussing device, as a result of which the location where the radiation beam is incident on the detector changes in the course of the time, have no adverse effect on the correct adjustment of the boundaries between the radiation-sensitive areas of the detector.

The focus-error detection systems described herein do not utilize special properties of the optical information structure or of the surface on which focussing is effected. Therefore, the focus-error detection system can be utilized in various devices in which a very accurate focussing is required, for example in microscopes.

What is claimed is:

1. A radiation-sensitive semiconductor device comprising a semiconductor body which is provided with at least two subelements on a substantially plane surface, said subelements forming radiation-sensitive diodes with the adjoining parts of the semiconductor body, the distance between the subelements being sufficiently small to enable the zone of the semiconductor body between the subelements to be depleted completely by the depletion regions associated with the subelements by applying a reverse voltage across the diodes, so as to inhibit charge transfer between the subelements, and a circuit for applying reverse voltage across the radiation-sensitive diodes and for detecting the photo-electric currents generated by incident radiation in the radiation-sensitive areas of the diodes comprising the depletion region, the circuit comprising means for applying different reverse voltages across the diodes as a function of a control signal, in order to adjust the boundary between the radiation-sensitive areas of the diodes.

2. A semiconductor device as claimed in claim 1, wherein the circuit comprises at least one differential amplifier for converting one of the photo-electric currents generated by the radiation into a measurement signal, for which purpose one of the subelements is coupled to the inverting input of the differential amplifier for applying the current to be converted to said input, the circuit further comprising means for applying a voltage whose amplitude depends on the control signal to the non-inverting input of the differential amplifier.

3. A semiconductor device as claimed in claim 2, further comprising a second differential amplifier for generating a further measurement signal which is a measure of the difference between the output voltage of the first differential amplifier and the control voltage on the non-inverting input of the first differential amplifier, for which purpose an input of the second differential amplifier is coupled to the output of the first differential amplifier, the circuit further comprising means for applying a voltage proportional to the control voltage to the other input of the second differential amplifier.

4. In an optical system, an opto-electronic focus-error detection system for detecting a deviation between an element and a focussing plane of an objective system, for use in an apparatus for at least one of reading a record carrier having an optically readable information structure and optically recording information in a record carrier, said focus-error detection system comprising a radiation-sensitive semiconductor device comprising a semiconductor body which is provided with at least two subelements on a substantially plane surface, said subelements forming radiation-sensitive diodes with the adjoining parts of the semiconductor body, the distance between the subelements being sufficiently small to enable the zone of the semiconductor body between the subelements to be depleted completely by the depletion regions associated with the subelements by applying a reverse voltage across the diodes, so as to inhibit charge transfer between the subelements, and a circuit for applying reverse voltage across the radiation-sensitive diodes and for detecting the photo-electric currents generated by incident radiation in the radiation-sensitive areas of the diodes comprising the depletion region, the circuit comprising means for applying different reverse voltages across the diodes as a function of a control signal, in order to adjust the boundary between the radiation-sensitive areas of the diodes.

5. An optoelectronic focus error detection system as claimed in claim 4, wherein the radiation-sensitive semiconductor device comprises a first pair and a second pair of adjacent subelements, a beam-splitting element in the optical path between the optically readable information structure and the semiconductor device to form a first subbeam and a second subbeam which are incident on the semiconductor device in the zone between the first pair of subelements and the zone between the second pair of subelements, respectively, the focus-error detection system comprising a circuit for deriving a focus-error signal from the photo-electric currents generated in the depletion regions associated with the subelements by the subbeams and a control device for deriving the control signals for the boundary-adjusting means from the photoelectric currents thus generated, such that a first sum of the photoelectric current corresponding to that subelement of the first pair which is situated farther from the center between the locations where the subbeams are incident on the semiconductor device and the photoelectric current corresponding to that subelement of the second pair which is situated nearer said center is substantially equal to a second sum of the electric currents associated with the other subelements of said pairs.

6. An optoelectronic focus-error detection system as claimed in claim 4, wherein the radiation-sensitive semiconductor device comprises four subelements which are situated symmetrically relative to a common center, an astigmatic element arranged between the reflecting element and the semiconductor device in the optical path of a light beam, and the focus-error detection system comprises a circuit for deriving a focus-error signal from the photoelectric currents generated by the beam in the depletion regions associated with the subelements and a control device for deriving the control signals for the boundary-adjusting means, such that the photoelectric currents corresponding to two diagonally-opposed subelements are substantially equal to each other.

7. An apparatus for at least one of optically reading and recording information with respect to a record carrier, which apparatus comprises an optoelectronic focus-error detection system for detecting a deviation between an element and a focussing plane of an objective system, for use in an apparatus for at least one of reading a record carrier having an optically readable information structure and optically recording information in a record carrier, said focus-error detection system comprising a radiation-sensitive semiconductor device comprising a semiconductor body which is provided with at least two subelements on a substantially plane surface, said subelements forming radiation-sensitive diodes with the adjoining parts of the semiconductor body, the distance between the subelements being sufficiently small to enable the zone of the semiconductor body between the subelements to be depleted completely by the depletion regions associated with the subelements by applying a reverse voltage across the diodes, so as to inhibit charge transfer between the subelements, and a circuit for applying reverse voltage across the radiation-sensitive diodes and for detecting the photo-electric currents generated by incident radiation in the radiation-sensitive areas of the diodes comprising the depletion region, the circuit comprising means for applying different reverse voltages across the diodes as a function of a control signal, in order to adjust the boundary between the radiation-sensitive areas of the diodes.

* * * * *